(12) United States Patent
Geng et al.

(10) Patent No.: US 10,402,013 B2
(45) Date of Patent: Sep. 3, 2019

(54) LEVEL CONVERTER AND OPERATION METHOD THEREOF, GATE DRIVING CIRCUIT AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Weibiao Geng, Beijing (CN); Yichiang Lai, Beijing (CN); Chunbing Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/553,044

(22) PCT Filed: Feb. 23, 2017

(86) PCT No.: PCT/CN2017/074529
§ 371 (c)(1),
(2) Date: Aug. 23, 2017

(87) PCT Pub. No.: WO2018/018887
PCT Pub. Date: Feb. 1, 2018

(65) Prior Publication Data
US 2018/0246616 A1   Aug. 30, 2018

(30) Foreign Application Priority Data
Jul. 29, 2016 (CN) .......................... 2016 1 0615583

(51) Int. Cl.
*G09G 3/36* (2006.01)
*G06F 3/041* (2006.01)
(Continued)

(52) U.S. Cl.
CPC ............ *G06F 3/0418* (2013.01); *G06F 3/044* (2013.01); *G06F 3/0416* (2013.01);
(Continued)

(58) Field of Classification Search
CPC . G09G 3/36; G09G 5/00; G11C 19/00; G02F 1/1345; G06F 3/038
See application file for complete search history.

(56) References Cited

U.S. PATENT DOCUMENTS

2006/0214718 A1* 9/2006 Chen .......................... G06F 1/04
327/333
2007/0248204 A1* 10/2007 Tobita .................... G11C 19/28
377/64
(Continued)

FOREIGN PATENT DOCUMENTS

CN  103823587 A  5/2014
CN  103943055 A  7/2014
(Continued)

OTHER PUBLICATIONS

International Search Report and Written Opinion dated May 26, 2017; PCT/CN2017/074529.

*Primary Examiner* — Pegeman Karimi
(74) *Attorney, Agent, or Firm* — Ladas & Parry LLP

(57) ABSTRACT

A level converter and an operation method thereof, a gate driving circuit and a display device. The level converter includes: N input terminals, configured to receive N input signals; N control signal terminals, configured to receive N control signals; N output terminals, configured to output N output signals; and a level converting unit, connected to the N input terminals, the N control signal terminal and the N output terminals and configured to, according to a n-th control signal of the control signal terminals, determine to directly output a n-th input signal as a n-th output signal, or convert the n-th input signal and then output the converted
(Continued)

n-th input signal as the n-th output signal; wherein when the n-th input signal is converted, the n-th input signal has shorter rise time and the n-th output signal has longer rise time, and N is a positive integer, $1 \leq n \leq N$.

18 Claims, 4 Drawing Sheets

(51) Int. Cl.
*G06F 3/044* (2006.01)
*G09G 3/3225* (2016.01)

(52) U.S. Cl.
CPC ......... *G09G 3/3225* (2013.01); *G09G 3/3648* (2013.01); *G09G 3/3677* (2013.01); *G09G 2300/0838* (2013.01); *G09G 2310/0286* (2013.01); *G09G 2320/0626* (2013.01)

(56) References Cited

U.S. PATENT DOCUMENTS

| | | |
|---|---|---|
| 2010/0085322 A1 | 4/2010 | Mamba et al. |
| 2014/0079175 A1* | 3/2014 | Wu .................. G11C 19/28 377/72 |
| 2015/0179128 A1* | 6/2015 | Huang .................. G09G 5/00 315/169.1 |
| 2017/0004759 A1* | 1/2017 | Yin .................. G09G 3/2092 |

FOREIGN PATENT DOCUMENTS

| | | |
|---|---|---|
| CN | 104036738 A | 9/2014 |
| CN | 105139798 A | 12/2015 |
| CN | 105355186 A | 2/2016 |

\* cited by examiner

LEVEL CONVERTER AND OPERATION METHOD THEREOF, GATE DRIVING CIRCUIT AND DISPLAY DEVICE

TECHNICAL FIELD

The present disclosure relates to a level converter and an operation method thereof, a gate driving circuit and a display device.

BACKGROUND

As display technique is booming progressively, a display device having a touch function is increasingly welcomed by people due to its advantages such as visual operation. According to different relative positions of a touch panel and a display panel, the existing display device having the touch function can be generally divided into two types, i.e., an on-cell touch panel and an in-cell touch panel. Compared with the on-cell touch panel, the in-cell touch panel is thinner and has higher transmissivity.

SUMMARY

There is proposed in the present disclosure a level converter and an operation method thereof, a gate driving circuit and a display device, which can solve the problem that the display of a part of rows of a picture is relatively dark due to long horizontal blanking time.

According to one aspect of the present disclosure, there is disclosed a level converter, comprising: N input terminals, configured to receive N input signals; N control signal terminals, configured to receive N control signals; N output terminals, configured to output N output signals; and a level converting unit, connected to the N input terminals, the N control signal terminal and the N output terminals and configured to, determine, according to a n-th control signal of a control signal terminal, to directly output a n-th input signal as a n-th output signal, or to convert the n-th input signal and output the converted n-th input signal as the n-th output signal; wherein when the n-th input signal is converted, the n-th input signal has shorter rise time and the n-th output signal has longer rise time, and N is a positive integer, $1 \leq n \leq N$.

For example, when the n-th control signal is equal to n, the n-th input signal is directly output as the n-th output signal; otherwise, the n-th input signal is converted.

For example, the level converting unit comprises first to N-th resistors and first to N-th switches, wherein a n-th resistor and a n-th switch are connected in parallel, one terminal of the n-th resistor and the n-th switch is connected to the n-th input signal, and the other terminal of the n-th resistor and the n-th switch is connected to the n-th output signal.

For example, when the n-th control signal is equal to n, the n-th switch is turned on; otherwise, the n-th switch is turned off.

For example, the switch is a thin film transistor.

For example, N=6.

According to another aspect of the present disclosure, there is disclosed a gate driving circuit, comprising a plurality of GOA units connected in cascade, every N GOA units being a group, GOA units in each group being used to receive first to N-th clock signals respectively, wherein N output signals of the level converter are provided as the first to N-th clock signals.

For example, N control signal terminals receive N control signals from a timing controller.

For example, the timing controller is used to detect an output row of a next GOA unit. When it is detected that the output row of the next GOA unit is a $(N_{LHB}+1)$-th row or a $(N_{LHB}-2)$-th row or a $(N_{LHB}+3)$-th row and the next GOA unit receives a n-th clock signal, the timing controller outputs a n-th control signal being equal to n, wherein long horizontal blanking time is started after charging of the $(N_{LHB})$-th row ends up.

According to another aspect of the present disclosure, there is disclosed a display device comprising the gate driving circuit as described above.

According to another aspect of the present disclosure, there is disclosed an operation method of the level converter, comprising: receiving N input signals by N input terminals respectively; receiving N control signals by N control signal terminals respectively; determining, by a level converting unit according to a n-th control signal of a control signal terminal, to directly output a n-th input signal as a n-th output signal, or to convert the n-th input signal and output the converted n-th input signal as the n-th output signal; and outputting N output signals by N output terminals respectively; wherein when the n-th input signal is converted, the n-th input signal has shorter rise time and the n-th output signal has longer rise time, and N is a positive integer, $1 \leq n \leq N$.

The level converter, the gate driving circuit and the display device according to the embodiments of the present disclosure can solve the problem that display of a part of rows of a picture is relatively dark due to long horizontal blanking time, so that quality of the picture can be improved.

DETAILED DESCRIPTION

Technical solutions in embodiments of the present disclosure will be described clearly and completely by combining with figures in the embodiments of the present disclosure. Obviously, the embodiments described below are just a part of embodiments of the present disclosure rather than all the embodiments. Based on the embodiments in the present disclosure, all the other embodiments obtained by those ordinary skilled in the art without paying any inventive labor belong to the scope sought for protection in the present disclosure.

Transistors adopted in all the embodiments of the present disclosure can be thin film transistors or field effective transistors or other devices having the same characteristics. In the present embodiment, connection manners of a drain and a source of each transistor can be interchangeable. Therefore, drains and sources of respective transistors in the embodiments of the present disclosure actually do not have any distinction. Herein, simply in order to distinguish two electrodes other than a gate of a transistor, one electrode is called as a drain, and the other electrode is called as a source.

The applicant notes that in the in-cell touch technique based on a GOA unit, since a long horizontal blank (LHB for short) time exists to wait completion of a touch action, during the LHB period, a subsequent GOA unit charges pixels of a corresponding row for a shorter time, which causes that the display of a part of rows of a picture is relatively dark.

There are proposed in the present disclosure a level converter, a gate driving circuit and a display device, which can solve the above problem that the display of a part of rows of a picture is relatively dark.

Figure 1:
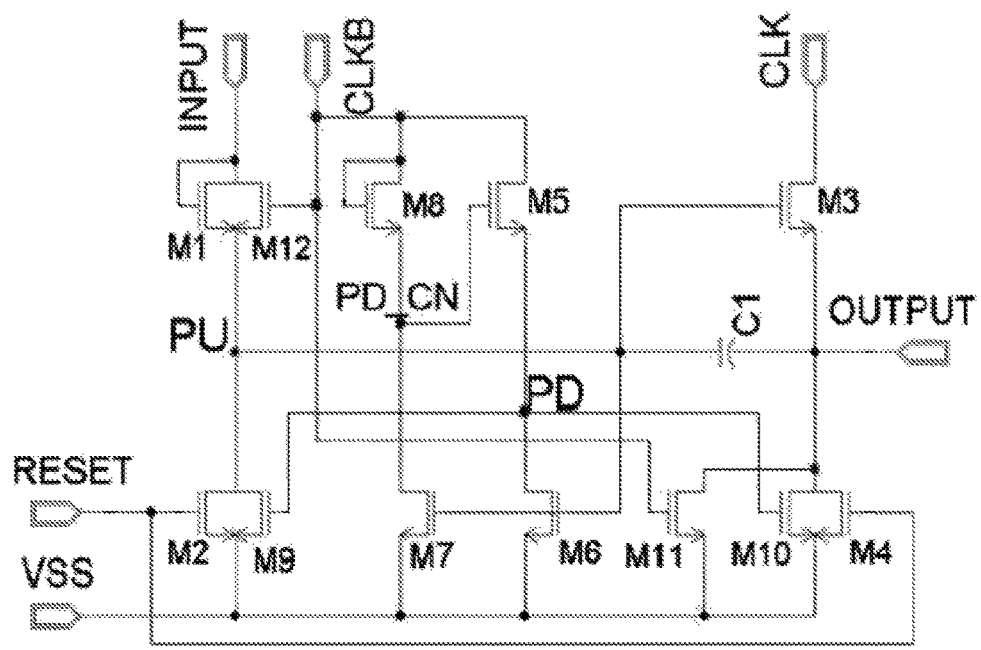
FIG. 1 is a circuit diagram of a GOA unit.
Figure 2:
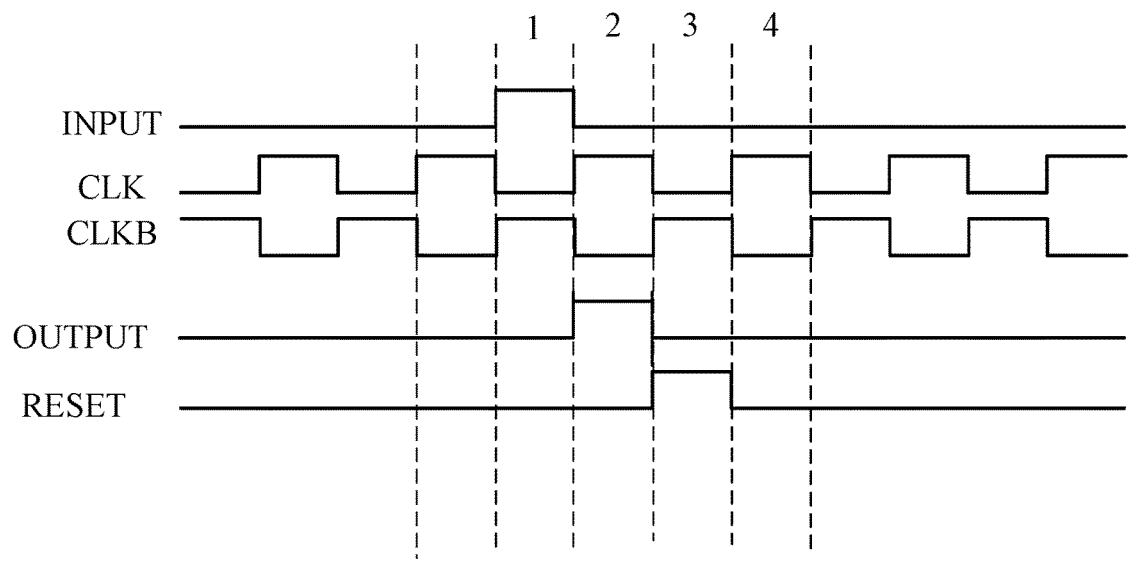
FIG. 2 is an operation timing diagram of the GOA unit in FIG. 1.

FIG. 1 is a circuit diagram of a GOA unit. FIG. 2 is an operation timing diagram of the GOA unit in FIG. 1. As shown in FIG. 1, the GOA unit comprises first to twelfth transistor M1-M12 and a first capacitor C1. The operation method of the GOA unit in FIG. 1 will be described below by combining with FIGS. 1 and 2.

Description is provided below by taking the transistors in FIG. 1 being N type transistors for example.

In a first phase (input phase) 1, an input terminal INPUT is at a high level, and an input transistor M1 is turned on to deliver the high level of the input terminal INPUT to a pull-up node PU. At this time, the pull-up node PU is at a first high voltage, such that an output transistor M3 is turned on. Since a first clock signal of a first clock signal terminal CLK is at a low level, an output terminal OUTPUT outputs a low level. In addition, in this phase, since the pull-up node PU is at a high level, a first pull-down control transistor M6 and a second pull-down control transistor M7 are turned on, such that a pull-down node PD is at a low level. Correspondingly, both of a node pull-down transistor M9 and an output pull-down transistor M10 are turned off. In addition, in this phase, a reset signal of a reset signal terminal RESET is at a low level, and a node reset transistor M2 is turned off.

In a second phase (output phase) 2, the input terminal INPUT is at a low level, the input transistor M1 is turned off, the reset signal terminal RESET is at a low level, the node reset transistor M2 keeps to be turned off, the pull-up node PU continues to make the output transistor M3 be turned on, the first clock signal of the first clock signal terminal CLK is at a high level, and the output terminal OUTPUT outputs the high level, and due to the voltage coupling effect of the first capacitor C1, at this time, the pull-up node PU is raised from a first high voltage to a second high voltage. In addition, in this phase, since the pull-up node PU is still at a high level, the first pull-down control transistor M6 and the second pull-down control transistor M7 keep to be turned on, the pull-down node PD is still at a low level, and correspondingly, both of the node pull-down transistor M9 and the output pull-down transistor M10 keep to be turned off.

In a third phase (reset phase) 3, the input terminal INPUT is at a low level, the input transistor M1 keeps to be turned off, the reset signal of the reset signal terminal RESET is at a high level, and the node reset transistor M2 and the output reset transistor M4 are turned on to pull down a pull-up signal at the pull-up node PU and an output signal of the output terminal OUTPUT to a power supply voltage of a first power supply voltage terminal VSS. In addition, in this phase, since the pull-up node PU is at a low level, both the first pull-down control transistor M6 and the second pull-down control transistor M7 are turned off. Since a second clock signal of a second clock signal terminal CLKB is at a high level, both a third pull-down control transistor M5 and a fourth pull-down control transistor M8 are turned on, such that the pull-down node PD jumps from a low level to a high level. Correspondingly, both the node pull-down transistor M9 and the output pull-down transistor M10 are turned on to pull down the pull-up signal at the pull-up node PU and the output signal of the output terminal OUTPUT to the power supply voltage of the first power supply voltage terminal VSS.

In a fourth phase (maintenance phase) 4, the second clock signal of the second clock signal terminal CLKB is at a low level, both the third pull-down control transistor M5 and the fourth pull-down control transistor M8 are turned off, and since the pull-up node PU is at a low level, both the first pull-down control transistor M6 and the second pull-down control transistor M7 keep to be turned off. A voltage of the pull-down node PD is at a high level, and correspondingly both the node pull-down transistor M9 and the output pull-down transistor M10 are turned on to keep pulling down the pull-up node PU and the output terminal OUTPUT to the power supply voltage of the first power supply voltage terminal VSS.

The first power supply voltage terminal VSS is a low power supply voltage terminal.

After that, before the next frame comes, the pull-up node PU is always at the low level, the pull-down node PD is always at the high level, and the output terminal OUTPUT always outputs a low voltage signal. When the next frame comes, after receiving the high level signal of the input terminal INPUT, the GOA unit re-executes the first phase.

It can be seen from FIG. 2 that the first clock signal of the first clock signal terminal CLK and the second clock signal of the second clock signal terminal CLKB have inverted phases.

Figure 3:
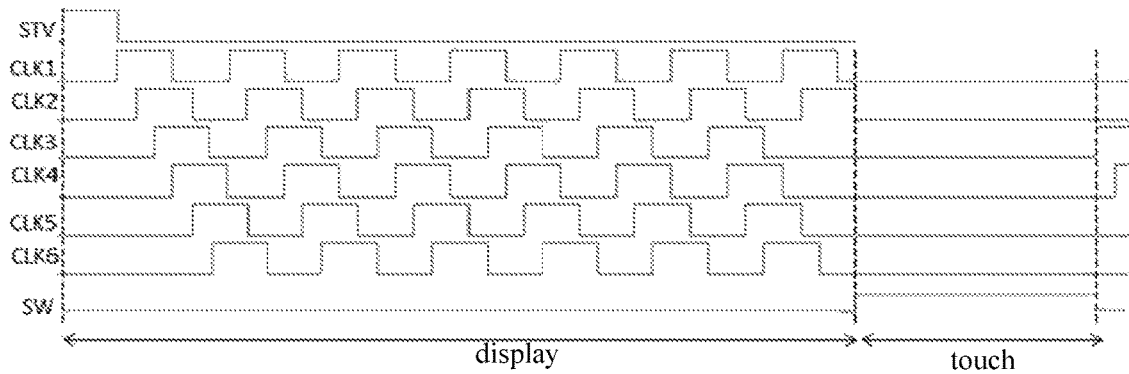
FIG. 3 is a timing diagram of respective signals in a gate driving circuit formed by the GOA units connected in cascade in FIG. 1.

FIG. 3 is a timing diagram of respective signals in a gate driving circuit formed by the GOA units connected in cascade in FIG. 1. In the example of FIG. 3, every six GOAs belong to a group. FIG. 3 shows timings of respective clock signals CLK1-CLK6 of the six GOA units, a start input signal STV inputted to a first GOA of the six GOA units and a signal SW for controlling whether to perform the touch. It shall be noted that although the present disclosure takes six GOA units in the gate driving circuit as a group for example, actually, random N GOA units can be connected in cascade as a group and a plurality of such groups are included in the gate driving circuit.

In the example of FIG. 3, an input terminal of the first GOA unit of the plurality of GOA units receives a first frame start signal STV. Input terminals of second to third GOA units receive second to third frame start signals (not shown) respectively. Input terminals of fourth to sixth GOA units receive output signals of first to third GOA units respectively. First clock signal terminals of first to sixth GOA units receive first to sixth clock signals CLK1-CLK6 respectively. According to the previous description, it can be known that output signals of first to sixth GOA units correspond to the first to sixth clock signals CLK1-CLK6. The SW signal controls whether to perform the touch.

Description is given below by combining with FIGS. 1 and 3. In the gate driving circuit as described above, long horizontal blanking time exists to wait for the completion of the touch action. During this period, the GOA unit is turned off to wait for the completion of the touch action. Assuming that the long horizontal blanking time is started after charging of a ($N_{LHB}$)-th row ends up, input signals of GOA units corresponding to ($N_{LHB}$+1)-th, ($N_{LHB}$+2)-th, ($N_{LHB}$+3)-th rows have been already active, and voltages at pull-up nodes PU of these GOA units are pulled up. However, within the long horizontal blanking time, due to existence of leakage current, the voltage at the pull-up node PU would decrease, which causes the output transistor M3 is not turned on sufficiently. When the first clock signal of the first clock signal terminal CLK is at a high level, due to lack of charging capacity of the output transistor M3, it would cause the rise time of output signals of output terminals OUTPUT of the GOA units corresponding to the ($N_{LHB}$+1)-th, ($N_{LHB}$+2)-th, ($N_{LHB}$+3)-th rows to increase, thereby causing that the time on charging pixels of the ($N_{LHB}$+1)-th, ($N_{LHB}$+2)-th, ($N_{LHB}$+3)-th rows is shortened, so that the picture display effect corresponding to the three rows would be relatively dark.

There are proposed in the present disclosure a level converter, a gate driving circuit and a display device, which are capable of prolonging the charging time of the GOA unit under the LHB time after the voltage at the pull-up node PU decreases relative to the charging time of the GOA unit under the non-LHB time, improving the phenomenon that the display of a part of rows of a picture is relatively dark due to decreasing of the voltage at the pull-up node PU, so as to improve the quality of the picture.

Figure 4:
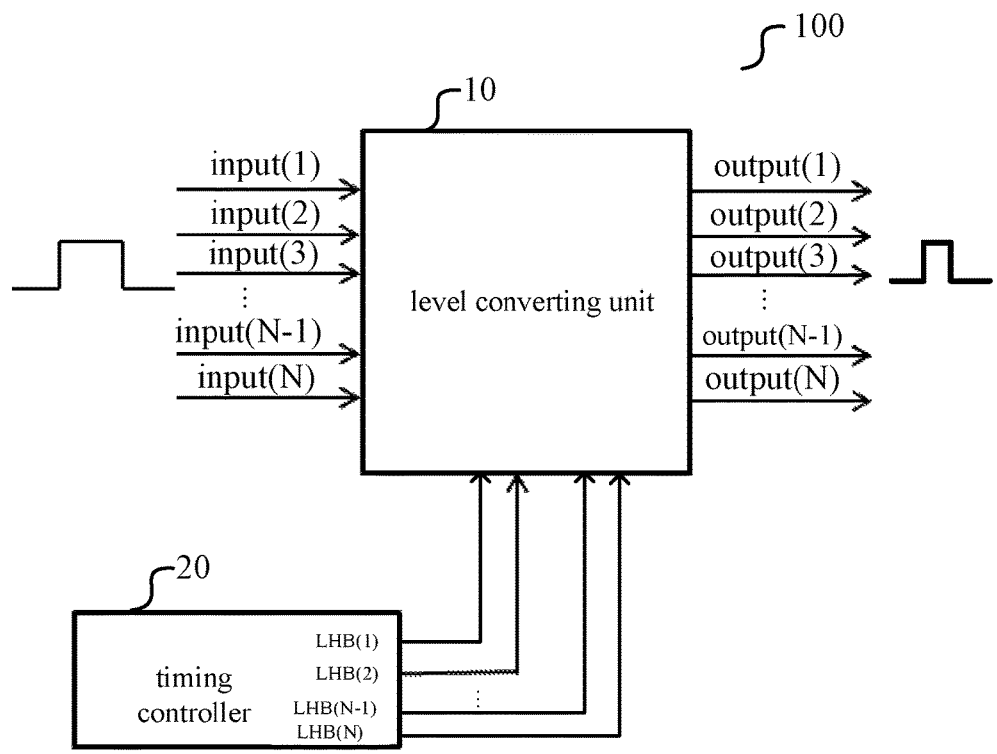
FIG. 4 is a schematic structure diagram of a level converter according to an embodiment of the present disclosure.

FIG. 4 is a schematic diagram of a level converter according to an embodiment of the present disclosure. As shown in FIG. 4, the level converter 100 comprises: N input terminals, configured to receive N input signals input(1)-input(N); N control signal terminals, configured to receive N control signals LHB(1)-LHB(N); N output terminals, configured to output N output signals output(1)-output(N); and a level converting unit 10, connected to the N input terminals, the N control signal terminals and the N output terminals and configured to, determine, according to a n-th control signal LHB(n) of a control signal terminal, to directly output a n-th input signal input(n) as a n-th output signal output(n), or to convert the n-th input signal input(n) and output the converted n-th input signal as the n-th output signal output(n).

Herein, when the n-th input signal is converted, the n-th input signal input(n) has shorter rise time and the n-th output signal output(n) has longer rise time, and N is a positive integer, 1≤n≤N.

In an embodiment, for example, when the n-th control signal LHB(n) is equal to n, the n-th input signal input(n) is directly outputted as the n-th output signal output(n); otherwise, the n-th input signal input(n) is converted. For example, in the case of LHB(2)=2, a second input signal input(2) is directly output as a second output signal output(2).

In an embodiment, for example, the N control signals LHB(1)-LHB(N) can come from a timing controller 20.

Figure 5:
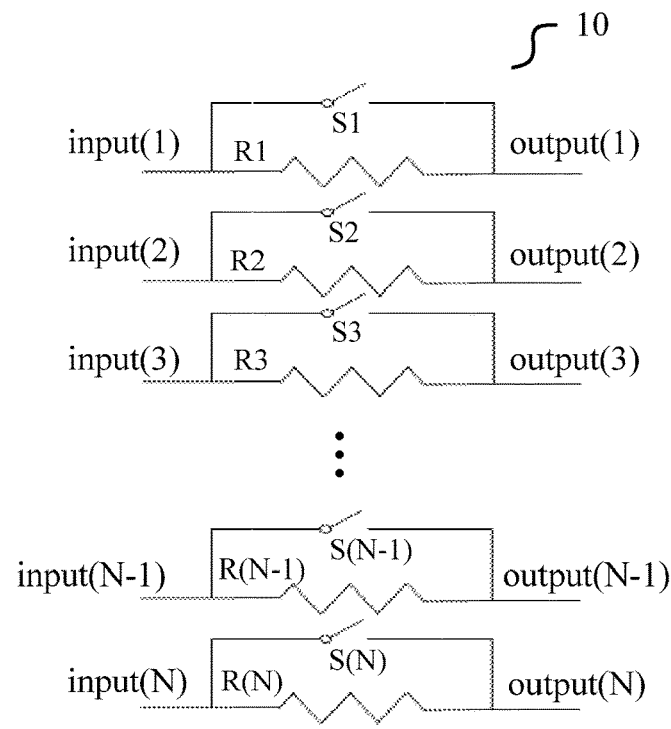
FIG. 5 is a circuit diagram of a level converting unit in a level converter according to an embodiment of the present disclosure.

FIG. 5 is a circuit diagram of a level converting unit 10 of a level converter 100 according to an embodiment of the present disclosure. As shown in FIG. 5, the level converting unit comprises first to N-th resistors and first to N-th switches. As for 1≤n≤N, the n-th resistor Rn and the n-th switch Sn are connected in parallel, one terminal of a n-th resistor Rn and a n-th switch Sn is connected to the n-th input signal input(n), and the other terminal of the n-th resistor Rn and the n-th switch Sn is connected to the n-th output signal output(n).

In an embodiment, for example, when the n-th control signal LHB(n) is equal to n, the n-th switch Sn is turned on; otherwise, the n-th switch Sn is turned off. For example, in the case of LHB(2)=2, the second switch S2 is turned on; in the case of LHB(2)≠2, the second switch S2 is turned off.

In an embodiment, for example, the switch is a thin film transistor.

In an embodiment, for example, N=6. In this case, the level converter adopting the level converting unit can be used to provide clock signals to the gate driving circuit discussed by combining FIGS. 1 and 3.

It can be understood that the specific circuit structure of the level converting unit 10 as shown in FIG. 5 is just an example, and other appropriate circuit structure can also be adopted, only if its function can be realized, to which the present disclosure does not make any limitation.

According to another aspect of the present disclosure, there is disclosed an operation method of the level converter 100, comprising: receiving N input signals input(1)-input(N) by N input terminals respectively; receiving N control signals LHB(1)-LHB(N) by N control signal terminals respectively; determining, by a level converting unit 10 according to a n-th control signal LHB(n) of a control signal terminal, to directly output a n-th input signal input(n) as a n-th output signal output(n), or to convert the n-th input signal input(n) and output the converted n-th input signal as the n-th output signal output(n); and outputting N output signals output(1)-output(N) by N output terminals respectively; wherein when the n-th input signal is converted, the n-th input signal input(n) has shorter rise time and the n-th output signal output(n) has longer rise time, and N is a positive integer, 1≤n≤N.

According to another aspect of the present disclosure, there is disclosed a gate driving circuit, comprising a plurality of GOA units connected in cascade. Every N GOA units belong to a group, GOA units in each group receive first to N-th clock signals respectively, and the N output signals of the level converter 100 are provided as the first to N-th clock signals, where N is a positive integer.

In an embodiment, for example, the N control signal terminals receive N control signals from the timing controller 20.

In an embodiment, for example, the timing controller 20 is used to detect output rows of a next GOA unit. When it is detected that the output row of the next GOA unit is a ($N_{LHB}$+1)-th row or a ($N_{LHB}$+2)-th row or a ($N_{LHB}$+3)-th row and the next GOA unit receives the n-th clock signal, the timing controller outputs a n-th control signal LHB(n) being equal to n, wherein long horizontal blanking time is started after charging of the ($N_{LHB}$)-th row ends up. $N_{LHB}$ can be set by the user.

For example, N=6.

Figure 6:
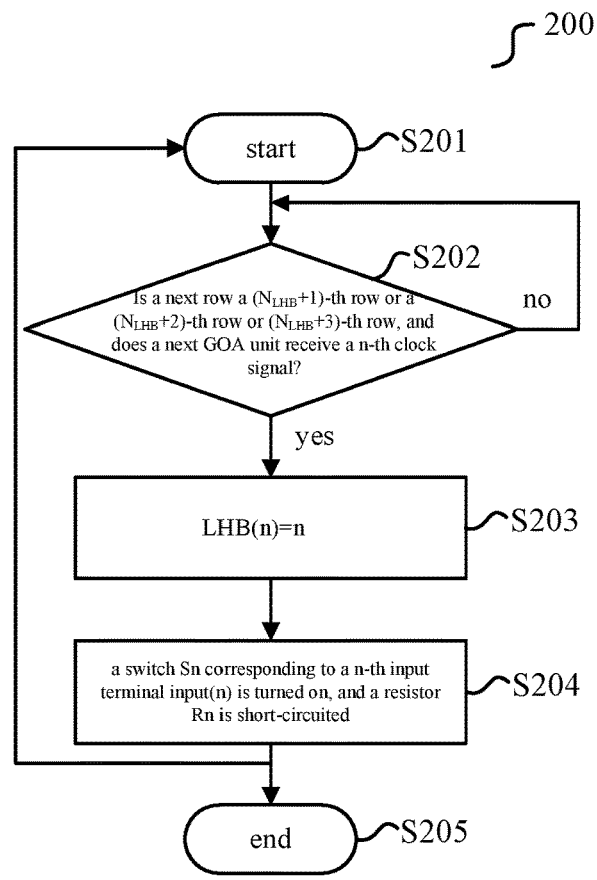
FIG. 6 is a flow diagram of a method of using a timing controller to control the level converting unit in the gate driving circuit as described above.

FIG. 6 is a flow diagram of a method of using the timing controller to control the level converting unit in the gate driving circuit described above. Description is given below by taking N=6 as an example. In this case, the level converter adopting the level converting unit described above can be used to provide clock signals to the gate driving circuit discussed by combining FIGS. 1 and 3.

Generally, the method 200 starts at step S201 and ends at step S205.

An output signal of an output terminal OUTPUT of the GOA unit of a current row (labeled as an n-th row) is an input signal of a GOA unit of a (n+3)-th row. In step S202, the timing controller 20 is used to detect an output row of the next GOA unit. If it is detected at step S202 that the output row of the next GOA unit is not any one of the ($N_{LHB}$+1)-th row, the ($N_{LHB}$+2)-th row, and the ($N_{LHB}$+3)-th row, then the method returns to step S201. If it is detected in step S202 that the output row of the next GOA unit is anyone of the ($N_{LHB}$+1)-th row, the ($N_{LHB}$+2)-th row, and the ($N_{LHB}$+3)-th row and the next GOA unit receives the n-th clock signal, then in step S203, the timing controller 20 outputs the n-th control signal LHB(n) being equal to n, i.e., a control signal with LHB(n)=n (1≤n≤6), to the level converting unit 10. In step S204, after the level converting unit receives the control signal with LHB(n)=n, the switch Sn corresponding to the n-th input terminal input(n) is turned on, and the resistor Rn is short-circuited. As understood by those skilled in the art, for a control signal, for example, a square wave signal, the rise time of the output signal via a switch is shorter than the rise time of the output signal via a resistor. Therefore, in the above example, the rise time of the output signal output(n) of this row is relatively short, that is, for the corresponding GOA unit, the rise time of the received first clock signal is relatively short, such that the rise time of the output signal of the GOA unit is shortened. And the voltage at the pull-up node PU of the GOA unit decreases due to the existence of the leakage current, thereby causing that the output transistor M3 is not turned on sufficiently. As a result, the rise time of the output signal of the GOA unit get longer. These two kinds of effects cancel out for each other, such that the rise time of the output signal of the GOA unit corresponding to this row is consistent with the rise time of the output signal of the GOA unit corresponding to other rows. Thus, the output signals of the GOA units corresponding to the ($N_{LHB}$+1)-th row, the ($N_{LHB}$+2)-th row, and the ($N_{LHB}$+3)-th row also maintain in consistency with the output signals of the GOA units corresponding to other rows, so as to improve the phenomenon of dark display of three of the ($N_{LHB}$+1)-th, ($N_{LHB}$+2)-th, and ($N_{LHB}$+3)-th rows and raise the quality of the picture.

Figure 7:
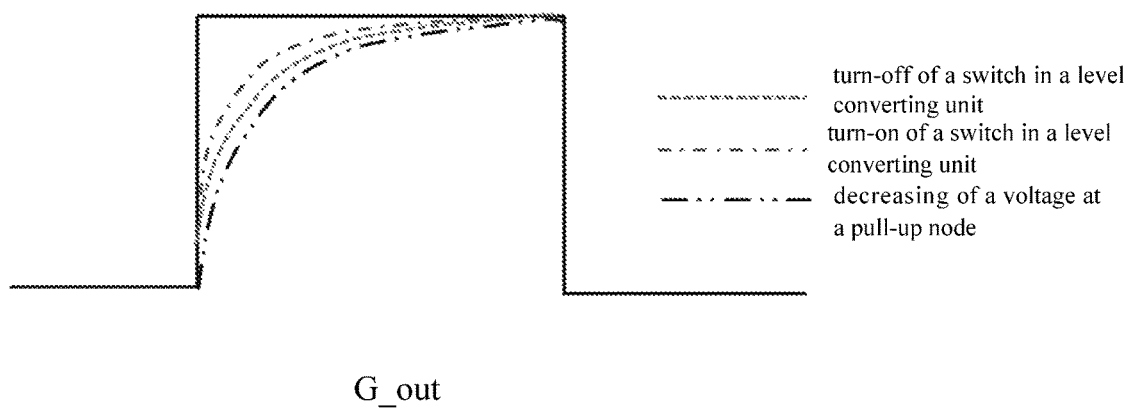
FIG. 7 is an effect diagram of corresponding output signals of a GOA unit in three cases of decreasing of a voltage at a pull-up node, turn-off of a switch in a level converting unit, and turn-on of a switch in the level converting unit.

FIG. 7 is an effect diagram of corresponding output signals G_out of a GOA unit in three cases of decreasing of a voltage at a pull-up node PU, turn-off of a switch in a level converting unit, and turn-on of a switch in the level converting unit. As shown in FIG. 7, in the first case, the voltage at the pull-up node PU decreases, and the rise time of a corresponding output signal G_out of the GOA unit is relatively long; in the second case, the switch in the level converting unit is turned off, and the rise time of the corresponding output signal G_out of the GOA unit is of medium size; in the third case, the switch in the level converting unit is turned on, and the rise time of the corresponding output signal G_out of the GOA unit is relatively short. The rise time of the corresponding output signal G_out of the GOA in the situation of combining the first case and the third case shall be approximately consistent with the rise time of the corresponding output signal G_out in the second case, so as to solve the above problem that the display of a part of rows of the picture is relatively dark due to the long horizontal blanking time.

According to another aspect of the present disclosure, there is disclosed a display device comprising the gate driving circuit as described above.

The display device herein can be any products or means having the display function such as an electronic paper, a mobile phone, a panel computer, a television set, a display, a notebook computer, a digital photo frame, a navigator, etc.

The level converter, the gate driving circuit and the display device according to the embodiments of the present disclosure can solve the problem that the display of a part of rows of a picture is relatively dark due to long horizontal blanking time, and thus the quality of picture can be improved.

The above descriptions are just specific implementations of the present disclosure. However, the protection scope of the present disclosure is not limited thereto. Any changes or replacements that can be easily conceived by any one of those skilled in the art who are familiar with the technical field within the technical scope of the present disclosure shall be covered within the protection scope of the present disclosure. Therefore, the protection scope of the present disclosure shall be subject to the protection scope of the present claims.

The present application claims the priority of a Chinese patent application No. 201610615583.8 filed on Jul. 29, 2016. Herein, the content disclosed by the above-mentioned Chinese patent application is incorporated in full by reference as a part of the present disclosure.

What is claimed is:

1. A level converter, comprising:
    N input terminals, configured to receive N input signals;
    N control signal terminals, configured to receive N control signals;
    N output terminals, configured to output N output signals; and
    a level converting unit, connected to the N input terminals, the N control signal terminals and the N output terminals and configured to,
    for each of the N input terminals, a n-th input terminal, directly output a n-th input signal at the n-th input terminal as a n-th output signal when the n-th control signal satisfies a predetermined condition, and convert the n-th input signal at the n-th input terminal and then output the converted n-th input signal as the n-th output signal when the n-th control signal fails to satisfy the predetermined condition;
    wherein when the n-th input signal is converted, the n-th input signal has a steeper rising edge than that of the n-th output signal, and N is a positive integer, 1≤n≤N.

2. The level converter according to claim 1, wherein when the n-th control signal is equal to n, the n-th input signal is directly output as the n-th output signal; otherwise, the n-th input signal is converted.

3. The level converter according to claim 2, the level converting unit comprises first to N-th resistors and first to N-th switches,
    wherein a n-th resistor and a n-th switch are connected in parallel, one terminal of the n-th resistor and the n-th switch is connected to the n-th input signal, and the other terminal of the n-th resistor and the n-th switch is connected to the n-th output signal.

4. The level converter according to claim 3, when the n-th control signal is equal to n, the n-th switch is turned on; otherwise, the n-th switch is turned off.

5. The level converter according to claim 3, wherein the switch is a thin film transistor.

6. The level converter according to claim 1, the level converting unit comprises first to N-th resistors and first to N-th switches,
    wherein a n-th resistor and a n-th switch are connected in parallel, one terminal of the n-th resistor and the n-th switch is connected to the n-th input signal, and the other terminal of the n-th resistor and the n-th switch is connected to the n-th output signal.

7. The level converter according to claim 6, when the n-th control signal is equal to n, the n-th switch is turned on; otherwise, the n-th switch is turned off.

8. The level converter according to claim 6, wherein the switch is a thin film transistor.

9. The level converter according to claim 1, wherein N=6.

10. A gate driving circuit, comprising a plurality of GOA units connected in cascade, every N GOA units being a group, GOA units in each group being used to receive first to N-th clock signals respectively, wherein the N output signals of the level converter according to claim 1 are provided as the first to N-th clock signals.

11. The gate driving circuit according to claim 10, wherein the n-th control signal of the level converter is equal to n, the n-th input signal is directly output as the n-th output signal; otherwise, the n-th input signal is converted.

12. The gate driving circuit according to claim 10, wherein the level converting unit of the level converter comprises first to N-th resistors and first to N-th switches,
wherein a n-th resistor and a n-th switch are connected in parallel, one terminal of the n-th resistor and the n-th switch is connected to the n-th input signal, and the other terminal of the n-th resistor and the n-th switch is connected to the n-th output signal, and when the n-th control signal is equal to n, the n-th switch is turned on; otherwise, the n-th switch is turned off.

13. The gate driving circuit according to claim 10, wherein N control signal terminals receive the N control signals from a timing controller.

14. The gate driving circuit according to claim 13, wherein the timing controller is configured to detect an output row of a next GOA unit, and when it is detected that the output row of the next GOA unit is a $(N_{LHB}+1)$-th row or a $(N_{LHB}+2)$-th row or a $(N_{LHB}+3)$-th row and the next GOA unit receives a n-th clock signal, the timing controller outputs a n-th control signal being equal to n, wherein long horizontal blanking time is started after charging of the $(N_{LHB})$-th row ends up.

15. A display device, comprising the gate driving circuit according to claim 10.

16. An operation method of the level converter according to claim 1, comprising:
receiving N input signals by N input terminals respectively;
receiving N control signals by N control signal terminals respectively;
for each of the N input terminals, a n-th input terminal, directly outputting, by a level converting unit, a n-th input signal at the n-th input terminal as a n-th output signal, or convert when the n-th control signal satisfies a predetermined condition, and converting, by the level converting unit, the n-th input signal at the n-th input terminal and then outputting the converted n-th input signal as the n-th output signal when the n-th control signal fails to satisfy the predetermined condition; and
outputting N output signals by N output terminals respectively;
wherein when the n-th input signal is converted, the n-th input signal has a steeper rising edge than that of the n-th output signal, and N is a positive integer, $1 \leq n \leq N$.

17. The operation method of the level converter according to claim 16, wherein the n-th control signal of the level converter is equal to n, the n-th input signal is directly output as the n-th output signal; otherwise, the n-th input signal is converted.

18. The operation method of the level converter according to claim 16, wherein the level converting unit of the level converter comprises first to N-th resistors and first to N-th switches,
wherein a n-th resistor and a n-th switch are connected in parallel, one terminal of the n-th resistor and the n-th switch is connected to the n-th input signal, and the other terminal of the n-th resistor and the n-th switch is connected to the n-th output signal, and when the n-th control signal is equal to n, the n-th switch is turned on; otherwise, the n-th switch is turned off.

* * * * *